United States Patent
Shimada et al.

(10) Patent No.: US 12,430,241 B2
(45) Date of Patent: Sep. 30, 2025

(54) MEMORY CONTROLLER, MEMORY CONTROLLER CONTROL METHOD, AND MEMORY SYSTEM

(71) Applicant: Kioxia Corporation, Tokyo (JP)

(72) Inventors: Katsuyuki Shimada, Tokyo (JP); Yuki Komatsu, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 42 days.

(21) Appl. No.: 18/460,516

(22) Filed: Sep. 1, 2023

(65) Prior Publication Data

US 2024/0095162 A1    Mar. 21, 2024

(30) Foreign Application Priority Data

Sep. 16, 2022   (JP) .................. 2022-148516

(51) Int. Cl.
| | | |
|---|---|---|
| *G06F 12/02* | (2006.01) | |
| *G06N 3/0455* | (2023.01) | |
| *G11C 16/04* | (2006.01) | |
| *G11C 16/10* | (2006.01) | |

(52) U.S. Cl.
CPC ....... *G06F 12/0246* (2013.01); *G06N 3/0455* (2023.01); *G11C 16/0483* (2013.01); *G11C 16/10* (2013.01)

(58) Field of Classification Search
CPC .... G06F 12/0246; G06N 3/0455; G06N 3/08; G11C 16/0483; G11C 16/10; G11C 29/028; G11C 29/021; G11C 11/5642
See application file for complete search history.

(56) References Cited

U.S. PATENT DOCUMENTS

| | | | |
|---|---|---|---|
| 11,024,401 B1 | 6/2021 | Khayat | |
| 2012/0203951 A1 | 8/2012 | Wood | |
| 2020/0090742 A1* | 3/2020 | Sekiguchi | G11C 16/34 |
| 2020/0210831 A1 | 7/2020 | Zhang | |
| 2021/0150770 A1 | 5/2021 | Appu | |
| 2021/0241845 A1* | 8/2021 | Li | G11C 11/54 |
| 2022/0093181 A1 | 3/2022 | Komatsu | |

FOREIGN PATENT DOCUMENTS

| | | |
|---|---|---|
| JP | 2015079495 A | 4/2015 |
| JP | 2022050898 A | 3/2022 |
| JP | 2022523912 A | 4/2022 |

* cited by examiner

*Primary Examiner* — Francisco A Grullon
(74) *Attorney, Agent, or Firm* — Kim & Stewart LLP

(57) ABSTRACT

According to one embodiment, a memory controller includes a compression unit that compresses two or more determination voltage values for threshold voltages of a memory cell to a vector quantity, the memory cell being capable of storing three or more data values. The memory controller further includes a storing unit that stores the vector quantity into a memory region. The memory controller further includes a decompression unit that decompresses the stored vector quantity to provide the determination voltage values.

17 Claims, 14 Drawing Sheets

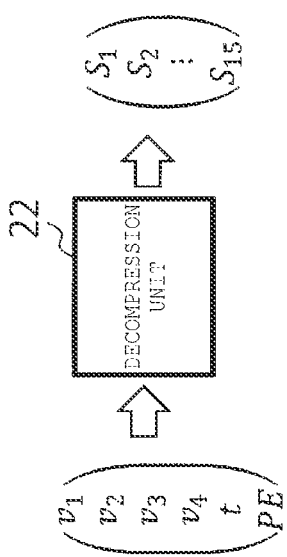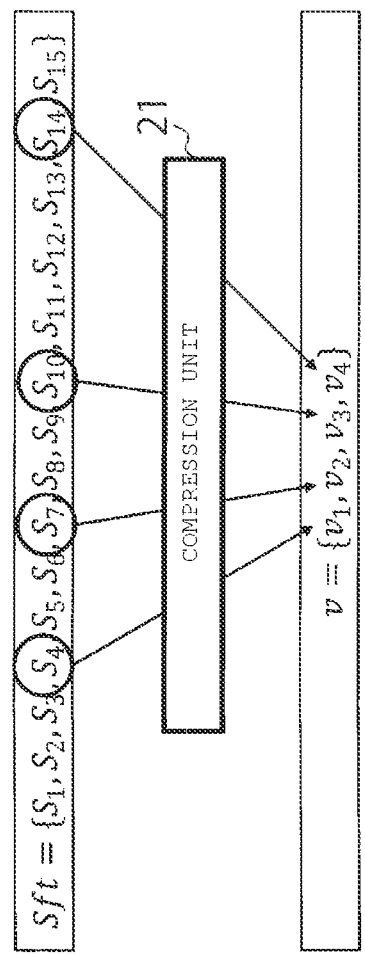
FIG. 11A
FIG. 11B

MEMORY CONTROLLER, MEMORY CONTROLLER CONTROL METHOD, AND MEMORY SYSTEM

CROSS-REFERENCE TO RELATED APPLICATION(S)

This application is based upon and claims the benefit of priority from Japanese Patent Application No. 2022-148516, filed Sep. 16, 2022, the entire contents of which are incorporated herein by reference.

FIELD

Embodiments described herein relate generally to a memory controller, a memory controller control method, and a memory system.

BACKGROUND

When a memory controller stores determination voltage data for a threshold voltage of a multilevel memory into a memory region of a memory system, the memory region may eventually become overloaded due to the storage of data regarding the determination voltage. On the other hand, if the determination voltage is compressed, the compressed determination voltage data can be stored into the memory region, but then the compressed determination voltage data must be decompressed. An error may occur between the original determination voltage data and the decompressed determination voltage data.

BRIEF DESCRIPTION OF THE DRAWINGS

FIGS. 11A and 11B are schematic diagrams illustrating an operation of a compression unit and a decompression unit according to a first embodiment.

DETAILED DESCRIPTION

Figure 1:
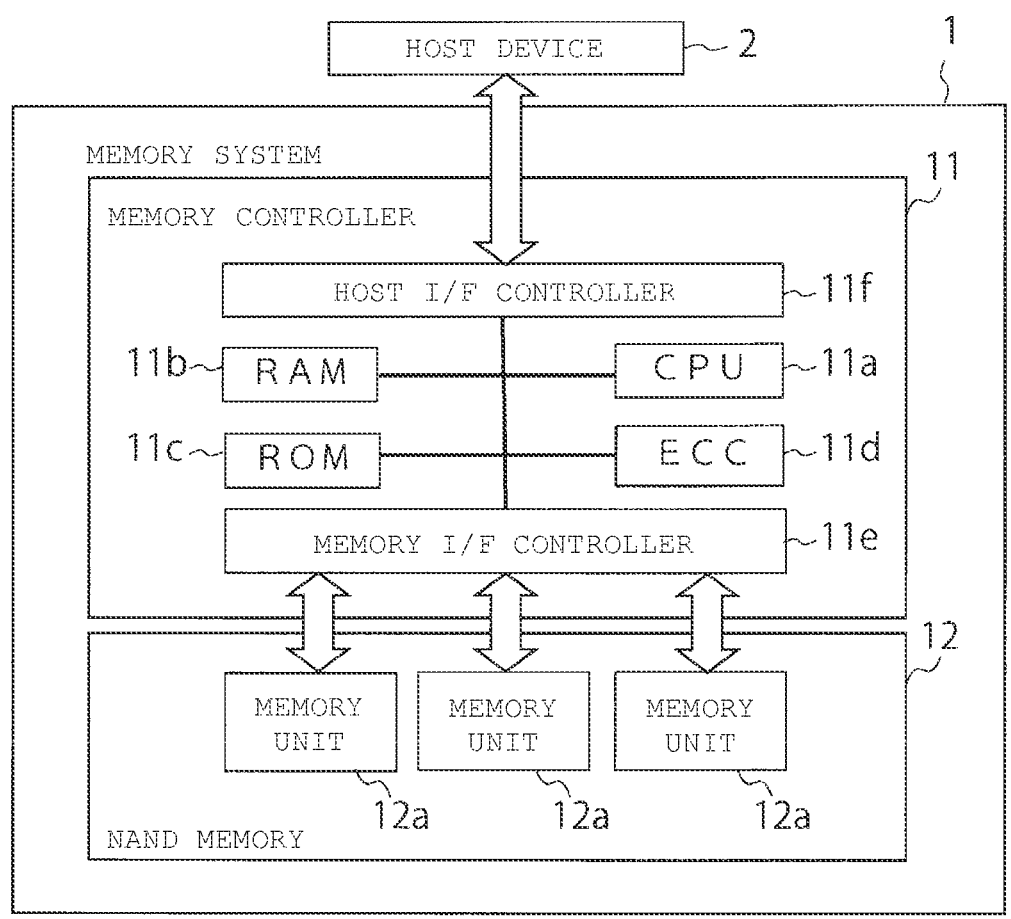
FIG. 1 is a block diagram illustrating a configuration of an information processing system according to a first embodiment.

Embodiments describe a memory controller, a memory controller control method, and a memory system capable of appropriately storing determination voltages for threshold voltages of a multilevel memory into a memory region.

In general, according to one embodiment, a memory controller includes a compression unit configured to compress two or more determination voltage values for a threshold voltage of a memory cell to a vector quantity, the memory cell being capable of storing three or more data values. The memory controller further includes a storing unit configured to store the vector quantity into a memory region. The memory controller further includes a decompression unit configured to decompress the stored vector quantity to provide the determination voltage values.

Hereinafter, certain example embodiments of the present disclosure will be described with reference to the drawings. In the drawings, the identical or substantially components are given the same reference symbols.

First Embodiment

FIG. 1 is a block diagram illustrating a configuration of an information processing system according to a first embodiment. FIG. 1 illustrates a case where a NAND memory 12 includes three memory units 12a.

The information processing system according to the first embodiment includes a memory system 1 and a host device 2. The memory system 1 is, for example, a memory card, a universal flash storage (UFS), or a solid-state drive (SSD). The memory system 1 functions, for example, as an external storage device for the host device 2. The host device 2 can be an information processing apparatus such as a personal computer, a server device, or a mobile device. The host device 2 may issue an access request (such as a read request or a write request) to the memory system 1.

The memory system 1 has a memory controller 11 and the NAND memory 12.

The memory controller 11 controls various operations of the memory system 1. For example, the memory controller 11 controls the reading of data from the NAND memory 12 (a read operation) based on a read request from the host device 2. In addition, the memory controller 11 also controls the writing of data to the NAND memory 12 (a write operation) based on a write request from the host device 2. The memory controller 11 includes a central processing unit (CPU) 11a, a random access memory (RAM) 11b, a read only memory (ROM) 11c, an error correcting code (ECC) circuit 11d, a memory interface (I/F) controller 11e, and a host I/F controller 11f. The memory controller 11 may further include a storage in which software is stored. The memory controller 11 may further include an electrical circuit (hardware) that executes an information process.

The CPU 11a is a processor that executes various programs. For example, firmware stored in the ROM 11c is loaded in the RAM 11b, and then executed by the CPU 11a. In addition, other software can be loaded in the RAM 11b and executed by the CPU 11a.

The RAM 11b is a volatile semiconductor memory from and to which data may be read and written. The RAM 11b provides a work area for the CPU 11a.

The ROM 11c is a semiconductor memory from which data may be read. The ROM 11c stores various types of data necessary for operations of the CPU 11a.

The ECC circuit 11d performs an error correction process. The ECC circuit 11d performs encoding for error correction when data (write data) is written to the NAND memory 12. Thus, an error correction code may be added to the write data. Further, when data (read data) is read from the NAND memory 12, the ECC circuit 11d performs error correction based on the error correction code that was added at the time of the writing of the data to the NAND memory 12. Thus, when the read data includes an error, it may be possible to correct the error.

The memory I/F controller 11e is a circuit that manages an interface between the memory controller 11 and the NAND memory 12. The memory I/F controller 11e controls data transfer between the memory controller 11 and the NAND memory 12 under control of the CPU 11a.

The host I/F controller 11f is a circuit that manages an interface between the memory controller 11 and the host device 2. The host I/F controller 11f controls data transfer between the memory controller 11 and the host device 2 under the control of the CPU 11a.

The NAND memory 12 functions as a multilevel memory capable of storing three or more values (bits) in each memory cell. For example, when the NAND memory 12 is a 16-level memory, each memory cell may store 16 different values. The 16 values include, for example, values from 0 to 15 (0000 to 1111 expressed in binary). The NAND memory 12 includes one or more memory units 12a. Each memory unit 12a has a memory cell array including a plurality of memory cells. The memory cell array functions as a memory region that is capable of storing data.

Figure 2:
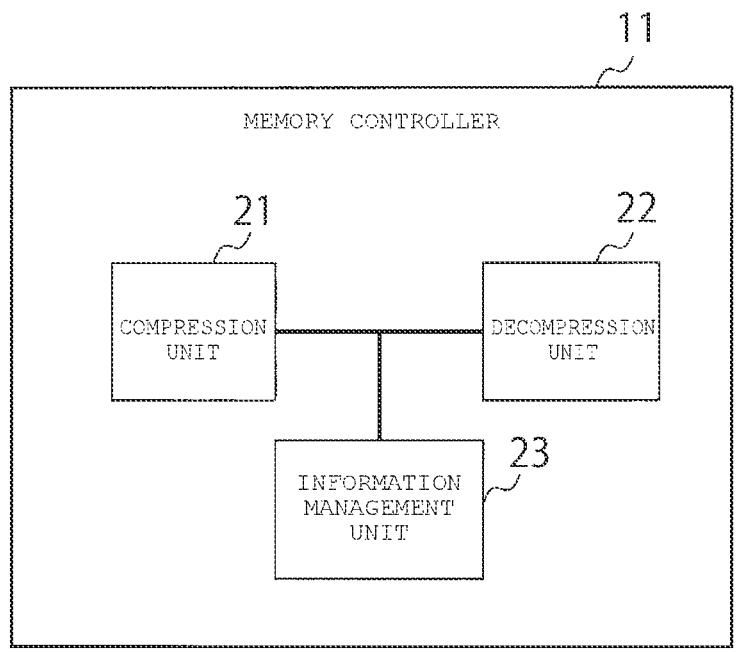
FIG. 2 is a block diagram illustrating functional aspects of a memory controller according to a first embodiment.

FIG. 2 is a block diagram illustrating a functional configuration of the memory controller 11 according to the first embodiment.

The memory controller 11 includes a compression unit 21, a decompression unit 22, and an information management unit 23. The information management unit 23 is an example of a storing unit. These depicted functions may be implemented by as firmware, software, and/or an electrical circuit (hardware). In addition, these functions may be implemented by any combination of firmware, software, and electrical circuit. For example, firmware stored in the ROM 11c is loaded in the RAM 11b and executed by the CPU 11a to implement these functions.

The compression unit 21 compresses determination voltages for a memory cell of the NAND memory 12 into vector quantities (compression data or compressed data).

The decompression unit 22 acquires a vector quantity from a memory region, and decompresses the vector quantity to a determination voltage (decompression data or decompressed data). The decompressed determination voltage from the vector quantity is used to specify a threshold voltage for the memory cell.

The process of compressing the determination voltage to the vector quantity by the compression unit 21 may include a process of converting the determination voltage to another quantity (a conversion quantity) and a process of compressing this conversion quantity to the vector quantity. In this case, the process in which the decompression unit 22 decompresses the vector quantity to the determination voltage may include a process of decompressing the vector quantity to this conversion quantity and a process of converting this conversion quantity to the determination voltage. An example of this conversion quantity is a shift quantity Sft, which will be described below.

The information management unit 23 stores the vector quantity into a memory region of the NAND memory 12. For example, the information management unit 23 manages various types of information necessary for an operation of the memory controller 11 by storing the information into the memory region. The information management unit 23 manages, for example, information about each block of each memory unit 12a as block management information. The determination voltage in the present embodiment can be set separately for each block of each memory unit 12a. Therefore, the determination voltage in the present embodiment is managed as block management information. In some examples, the determination voltage may be set for each word line in each block (on a word line basis). Also, in such a case, the determination voltage may still be managed as block management information.

Here, aspects of the determination voltage will be described. The NAND memory 12 according to the present embodiment may store three or more values into each memory cell. Therefore, a distribution of threshold voltages of the NAND memory 12 has three or more peaks called lobes. As a result, two or more determination voltages are used to identify the threshold voltage of a memory cell. For example, when the NAND memory 12 is a 16-level memory, the distribution of the possible threshold voltages has 16 lobes. In this case, 15 types of determination voltages are used to specify (identify) the threshold voltage. The determination voltage is used when reading data from the NAND memory 12. The determination voltage is also called a read threshold voltage.

These determination voltages are tracked (managed) by being stored in the memory region of the NAND memory 12. If the determination voltages were to be stored in the memory region as it is (without compression), the memory region may become overloaded or require too much space because there are many determination voltages necessary for a multilevel memory. Therefore, the memory controller 11 according to the present embodiment compresses the determination voltage, and stores compressed data of the determination voltage into the memory region. Thus, it is possible to reduce overload on the memory region.

On the other hand, if the determination voltage is compressed, the compressed data is stored into the memory region, but when the compressed data of the determination voltage is decompressed, an error may occur such that the original determination voltage is not reflected by the data produced by decompression of the determination voltage. The memory controller 11 according to the present embodiment compresses the determination voltages to a vector quantity instead of a scalar quantity. Thus, it is possible to reduce overload on the memory region while reducing the errors.

Additional aspects of the compression unit 21, decompression unit 22, and information management unit 23 according to the present embodiment will be described below.

Figure 3:
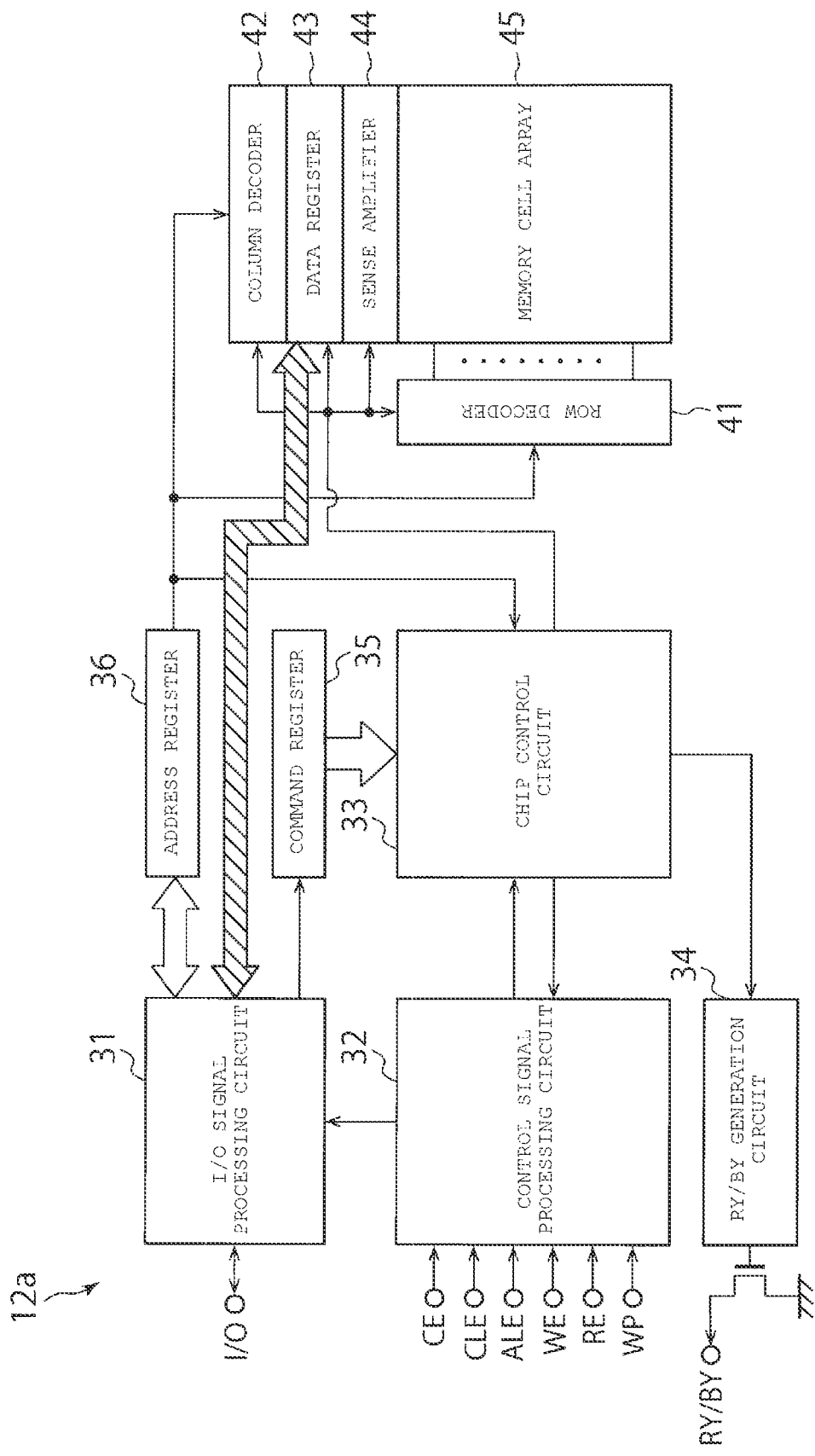
FIG. 3 is a block diagram illustrating aspects of a memory unit according to a first embodiment.

FIG. 3 is a block diagram illustrating a configuration of the memory unit 12a according to the first embodiment.

Each memory unit 12a includes an input/output (I/O) signal processing circuit 31, a control signal processing circuit 32, a chip control circuit 33, an RY/BY generation circuit 34, a command register 35, an address register 36, a row decoder 41, a column decoder 42, a data register 43, a sense amplifier 44, and a memory cell array 45. The row decoder 41, the column decoder 42, the data register 43, and the sense amplifier 44 function as interfaces for a read operation, a write operation, and an erasing operation for the memory cell array 45.

The I/O signal processing circuit 31 is a buffer circuit that processes an input signal to the memory unit 12a and an output signal from the memory unit 12a. A command, an address, and data latched by the I/O signal processing circuit 31 are distributed to the command register 35, the address register 36, and the data register 43, respectively.

The control signal processing circuit 32 processes control signals supplied to the memory unit 12a. The control signal processing circuit 32 controls the distribution by the I/O signal processing circuit 31 based on the control signals supplied to the memory unit 12a. The control signals input to the control signal processing circuit 32 are, for example, a chip enable (CE) signal, a command latch enable (CLE) signal, an address latch enable (ALE) signal, a write enable (WE) signal, a read enable (RE) signal, a write protest (WP) signal, or the like. The control signal processing circuit 32 also transfers the control signals to the chip control circuit 33.

The chip control circuit 33 controls a memory chip (memory unit 12a). The chip control circuit 33 controls an operation of the memory unit 12a based on the control signals transferred from the control signal processing circuit 32. An operation mode of the chip control circuit 33 can be changed, for example, when a state of the chip control circuit 33 transitions according to a control signal.

The RY/BY generation circuit 34 outputs a ready (RY) signal and a busy (BY) signal. The RY/BY generation circuit 34 selectively outputs the RY signal and the BY signal under control of the chip control circuit 33. The RY signal is output when the memory unit 12a is not presently performing an operation (ready state). The BY signal is output when the memory unit 12a is in operation (busy state).

The command register 35 stores a command. The command stored in the command register 35 is read by the chip control circuit 33.

The address register 36 stores an address. The address stored in the address register 36 is read by the chip control circuit 33, the row decoder 41, and the column decoder 42.

The row decoder 41 controls a word line of the memory cell array 45. The row decoder 41 applies a voltage to the word line(s) in the memory cell array 45 based on a row address read from the address register 36.

The column decoder 42 controls a latch circuit of the data register 43. The column decoder 42 selects the latch circuit in the data register 43 based on a column address read from the address register 36.

The data register 43 stores data to be written or data that has been read. The data register 43 stores data from the I/O signal processing circuit 31 and data from the sense amplifier 44.

The sense amplifier 44 performs an operation on a bit line of the memory cell array 45. The sense amplifier 44 senses data read to the bit line(s) in the memory cell array 45.

The memory cell array 45 includes a plurality of memory cells. The memory cell array 45 functions as a memory region capable of storing data. The NAND memory 12 according to the present embodiment is a three-dimensional semiconductor memory in which these memory cells are arranged in a three-dimensional array.

Figure 4:
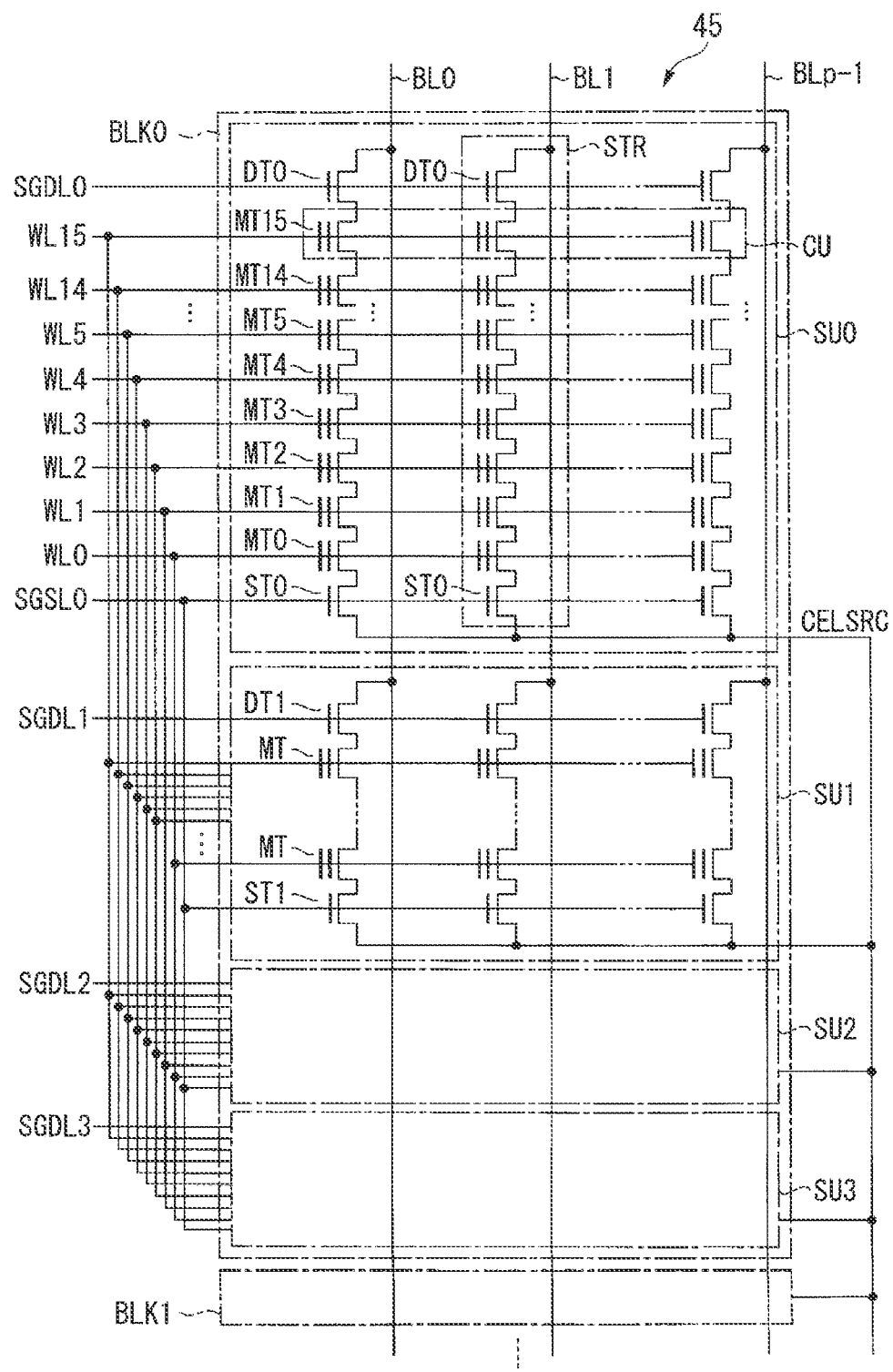
FIG. 4 is a circuit diagram of a memory cell array according to a first embodiment.

FIG. 4 is a circuit diagram illustrating a configuration of the memory cell array 45 according to the first embodiment.

The memory cell array 45 includes a plurality of blocks. FIG. 4 illustrates a block BLK0 and a block BLK1, as examples of the plurality of blocks. Hereinafter, a configuration of a block according to the present embodiment will be described by using the block BLK0 as a representative example.

The block BLK0 includes a plurality of string units SU0 to SU3. Each of the string units SU0 to SU3 includes p NAND strings STR (p is an integer of 2 or more) between p bit lines BL0 to BLp-1 and a cell source line CELSRC. For example, in the string unit SU0, the NAND string STR between the bit line BL0 and the cell source line CELSRC includes memory cell transistors (memory cells) MT0 to MT15 on word lines WL0 to WL15, and select transistors (select gates) ST0 and DT0 on selection lines SGSL0 and SGDL0. The selection line SGSL0 is called a source-side selection line. The selection line SGDL0 is called a drain-side selection line. In the present embodiment, the other NAND strings STR have a similar structure.

Figure 5:
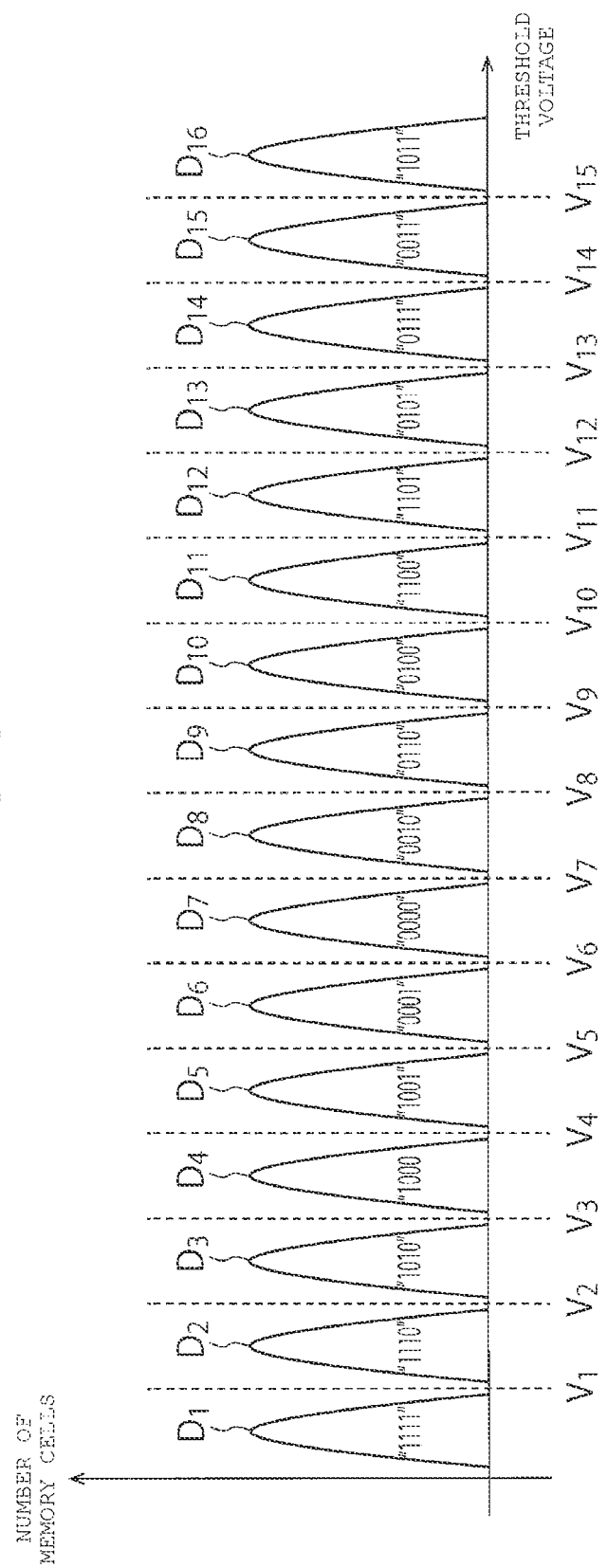
FIG. 5 is a graph illustrating a relationship between threshold voltages and memory cell numbers for multilevel data according to a first embodiment.

FIG. 5 is a graph illustrating a relationship between a threshold voltage and the number of memory cells having that threshold voltage for the first embodiment.

FIG. 5 illustrates distributions $D_1$ to $D_{16}$ for sixteen nominal threshold voltages. When the NAND memory 12 is a 16-level memory, the distribution of the threshold voltages has 16 lobes. The distribution $D_1$ illustrates a distribution of threshold voltages of a memory cell in which a value "15" (1111 in binary) is stored. The distribution $D_2$ illustrates a distribution of threshold voltages of a memory cell in which a value "14" (1110 in binary) is stored. The distributions $D_3$ to $D_{16}$ are similarly coded.

FIG. 5 also illustrates determination voltages $V_1$ to $V_{15}$. When the NAND memory 12 is the 16-level memory, the fifteen determination voltages $V_1$ to $V_{15}$ are used to identify the particular threshold voltages ($D_1$ to $D_{16}$). For example, the determination voltage $V_1$ is used to distinguish a threshold voltage of the memory cell for which the value 15 (1111 in binary) is stored from a threshold voltage of the memory cell in which the value 14 (1110 in binary) is stored. Similarly, the determination voltage $V_2$ is used to distinguish the threshold voltage of the memory cell for which the value 14 (1110 in binary) is stored from a threshold voltage of a memory cell for which a value 10 (1010 in binary) is stored. The determination voltages $V_3$ to $V_{15}$ also function in the same manner for other threshold voltages.

Next, with reference to FIGS. 6A to 7B, the memory controller 11 according to the first embodiment will be compared with a memory controller 11 according to a comparative example.

Figures 6A, 6B, 6C:
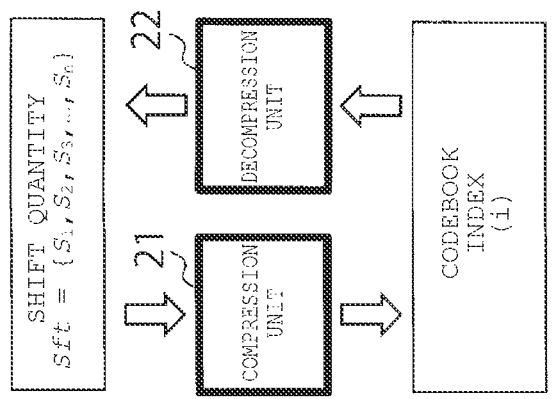
FIGS. 6A to 6C are diagrams illustrating an operation of a memory controller according to a comparative example.

FIGS. 6A to 6C are diagrams illustrating an operation of the memory controller 11 according to the comparative example. The memory controller 11 according to the comparative example is generally similar to the memory controller 11 of the first embodiment illustrated in FIGS. 1 to 5.

FIG. 6A illustrates the compression unit 21 and the decompression unit 22 of the memory controller 11 according to the comparative example. The compression unit 21 according to the comparative example compresses the shift quantity Sft to a codebook index i. In addition, the decompression unit 22 according to the comparative example decompresses the codebook index i to the shift quantity Sft. The shift quantity Sft is a vector quantity including n (n is an integer of 2 or more) components $S_1$ to $S_n$ (Sft={$S_1$, $S_2$, $S_3$, . . . and $S_n$}). However, the codebook index i is a scalar quantity.

When the NAND memory 12 according to the comparative example is a 16-level memory, the fifteen different determination voltages $V_1$ to $V_{15}$ are used to specify a threshold voltage. However, the component $S_k$ of the shift quantity Sft is a shift value (offset) for the determination voltage $V_k$ from a predetermined voltage $V_{k(0)}$ (k is an integer satisfying 1≤k≤n). Therefore, the component $S_k$ of the shift quantity Sft can be represented by $S_k=V_k-V_{k(0)}$. As a result, when the fifteen determination voltages $V_1$ to $V_{15}$ are used, the shift quantity Sft is a 15th-degree vector including the fifteen components $S_1$ to $S_{15}$. In the following, the component $S_k$ of the shift quantity Sft is also referred to as "shift value $S_k$". The predetermined voltages $V_{1(0)}$ to $V_{15(0)}$ are also referred to as reference values or default values for the determination voltages $V_1$ to $V_{15}$.

FIG. 6B illustrates a codebook table managed by the information management unit 23 according to the comparative example. The codebook table indicates a correspondence between the codebook index i and a codebook value ("codebook"). The codebook table is a table in which typical shift quantities Sft are listed as the codebook values. For example, when the shift quantity Sft is compressed to the codebook index i, when the shift quantity Sft is closest to a codebook $\{S_1^1, S_2^1, S_3^1, \ldots$ and $S_n^1\}$ having the codebook index i of "1", compression data of the shift quantity Sft is "1". In this case, if the codebook index i is decompressed to the shift quantity Sft, the compression data "1" is decompressed to decompression data $\{S_1^1, S_2^1, S_3^1, \ldots$ and $S_n^1\}$. That is, if this shift quantity Sft=$\{S_1, S_2, S_3, \ldots$ and $S_n\}$ is compressed and decompressed, a shift quantity obtained by the compression and the decompression is $\{S_1^1, S_2^1, S_3^1, \ldots$ and $S_n^1\}$.

FIG. 6C illustrates block management information managed by the information management unit 23 according to the comparative example. The block management information indicates a correspondence between a block index b and the codebook index i. The block index b is an index value for specifying each block (FIG. 4) of the NAND memory 12. For example, when the shift quantities Sft of blocks having the block indices b of "b1", "b2", and "b3" are respectively compressed to have the codebook indices i of "i1", "i2", and "i3", the block management information illustrated in FIG. 6C is set. That is, "i1", "i2", and "i3" are stored into fields of the codebook indices i of the blocks "b1", "b2", and "b3", respectively. The block index b is, for example, a scalar quantity.

The shift quantity Sft according to the comparative example is compressed to the codebook index i, and stored into the memory region. Thus, it is possible to reduce overload on the memory region by this process. However, if the shift quantity Sft is compressed to the codebook index i and the codebook index i is decompressed to the shift quantity Sft (codebook), an error (difference) between the original shift quantity Sft and the decompressed shift quantity Sft (codebook) may occur. For example, in the example described above, an error occurs between the original shift quantities $\{S_1, S_2, S_3, \ldots$ and $S_n\}$ and the decompressed shift quantity $\{S_1^1, S_2^1, S_3^1, \ldots$ and $S_n^1\}$ when the original shift quantities do not exactly match the closest codebook value.

Figures 7A, 7B:
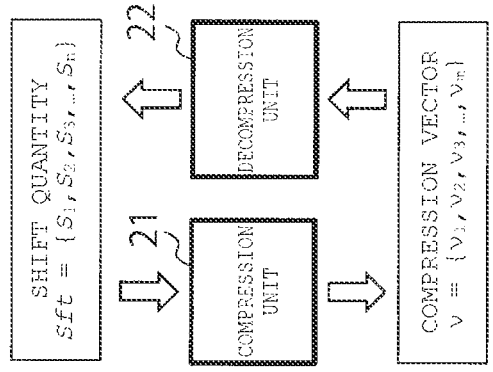
FIGS. 7A and 7B are diagrams illustrating an operation of a memory controller according to a first embodiment.

FIGS. 7A and 7B are diagrams illustrating an operation of the memory controller 11 according to the first embodiment.

FIG. 7A illustrates the compression unit 21 and the decompression unit 22 of the memory controller 11 according to the present embodiment. The compression unit 21 compresses the shift quantity Sft to a compression vector v. In addition, the decompression unit 22 decompresses the compression vector v to the shift quantity Sft. As described above, the shift quantity Sft is a vector quantity including n (n is an integer of 2 or more) components $S_1$ to $S_n$ (Sft=$\{S_1, S_2, S_3, \ldots$ and $S_n\}$). However, the compression vector v can be a vector quantity including m (m is an integer of 2 or more) components $v_1$ to $v_n$ (v=$\{v_1, v_2, v_3, \ldots$ and $v_n\}$), where m is an integer smaller than n (n>m≥2).

When the NAND memory 12 is a 16-level memory, the fifteen determination voltages $V_1$ to $V_{15}$ are used to specify threshold voltages as described above. In this case, the shift quantity Sft is a 15th-degree vector including the fifteen components (shift values) $S_1$ to $S_{15}$. But the degree m of the compression vector v is an integer of 2 to 14, for example, 4. In this case, the compression vector v is a quartic vector including four components $v_1$ to $v_4$.

FIG. 7B illustrates block management information managed by the information management unit 23 according to the first embodiment. The block management information indicates a correspondence between the block index b and the compression vector v. The block index b is an index value for specifying each block (FIG. 4) of the NAND memory 12. For example, when the shift quantities Sft of blocks having the block indices b of "b1", "b2", and "b3" are respectively compressed to have the compression vectors v of "v1", "v2", and "v3", the block management information illustrated in FIG. 7B is set. That is, "v1", "v2", and "v3" are stored in fields of the compression vectors v of the blocks "b1", "b2", and "b3", respectively. The block index b is, for example, a scalar quantity.

The block management information further indicates a correspondence between the block index b and a fail bit count (FBC). The FBC is the total number of erroneously read bits when stored data of each block is read. In FIG. 7B, "FBC1", "FBC2", and "FBC3" are stored in fields of the FBCs of the blocks "b1", "b2", and "b3", respectively.

The shift quantity Sft in the first embodiment is compressed to the compression vector v (vector quantity) instead of the codebook index I (scalar quantity). Thus, it is possible to reduce overload on the memory region while reducing the error since compressing the shift quantity Sft to a vector quantity generally reduces the information quantity lost by the compression, as compared to compressing a scalar quantity.

Next, an estimation unit 51 according to the first embodiment will be described with reference to FIGS. 8 to 10.

Figure 8:
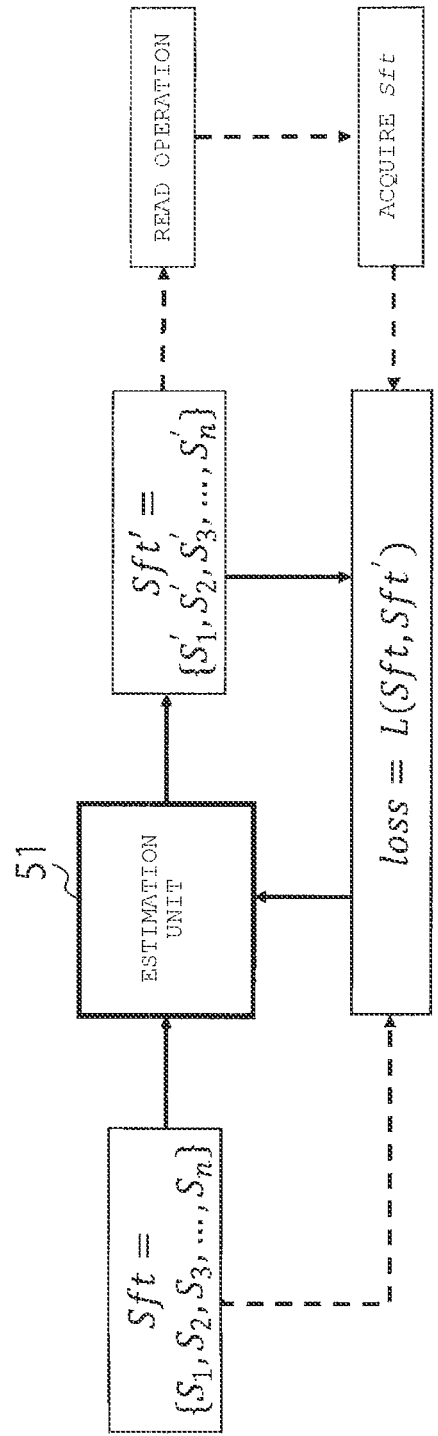
FIG. 8 is a schematic diagram illustrating an operation of an estimation unit according to a first embodiment.

FIG. 8 is a schematic diagram illustrating an operation of the estimation unit 51 according to the first embodiment.

At least any one of the compression unit 21 and the decompression unit 22 may include an estimation unit 51 for improving read accuracy through training (machine learning). For example, by training the compression unit 21 with the estimation unit 51, it is possible to perform compression such that an error between the original shift quantity Sft and the decompressed shift quantity Sft is small. In addition, by training the decompression unit 22 with the estimation unit 51, it is possible to perform decompression such that the error between the original shift quantity Sft and the decompressed shift quantity Sft is small. The estimation unit 51 according to the present embodiment may also be applicable to the decompression unit 22 illustrated in FIG. 11B, the compression unit 21 (second embodiment) illustrated in FIG. 13, and the decompression unit 22 (second embodiment) illustrated in FIG. 13.

The estimation unit 51 may be implemented by any of firmware, software, and/or an electrical circuit (hardware). In addition, the estimation unit 51 may be implemented by combining two or more of firmware, software, and electrical circuit. In the present embodiment, firmware stored in the ROM 11c illustrated in FIG. 1 is loaded in the RAM 11b, and executed by the CPU 11a to implement the estimation unit 51. For example, the estimation unit 51 corresponds to a machine learning model such as a deep neural network (DNN) model. With the present embodiment, after shipment of the memory system 1 by a manufacturer of the memory system 1, the errors may be reduced by training (machine learning).

Hereinafter, an operation of the estimation unit 51 illustrated in FIG. 8 will be described.

In FIG. 8, the shift quantity Sft is input to the estimation unit 51, and a shift quantity Sft' is output from the estimation unit 51. The estimation unit 51 compresses the shift quantity Sft to the compression vector v in the same manner as the compression unit 21, and decompresses the compression vector v to the shift quantity Sft in the same manner as the decompression unit 22. FIG. 8 illustrates the symbol Sft' for distinguishing the decompressed shift quantity Sft from the original shift quantity Sft. Therefore, the estimation unit 51 outputs the shift quantity Sft' obtained by compressing and decompressing the original shift quantity Sft. The fact that the shift quantity Sft is different from the shift quantity Sft' means that the answer "Sft'" of the estimation unit 51 may be different from the correct answer "Sft".

FIG. 8 also illustrates a loss function L (Sft, Sft'). The loss function L (Sft, Sft') is a function that outputs a value corresponding to an error between the shift quantity Sft and the shift quantity Sft'. The output value of the loss function L (Sft, Sft') is input to the estimation unit 51 as a loss. Training in the present embodiment is performed by using the output value of the loss function L (Sft, Sft'). In other examples, the output value of the loss function L (Sft, Sft') may be calculated by a functional block other than the estimation unit 51 in the memory controller 11 or may be calculated by the estimation unit 51. The training in the present embodiment is performed, for example, such that the output value of the loss function L (Sft, Sft') approaches zero.

The training may be performed at any time. For example, the training may be performed when a read operation is performed in the memory system 1. In addition, the training may be performed when compression is performed by the compression unit 21. In addition, the training may be performed when a patrol read or a retry occurs in the memory system 1.

Figure 9:
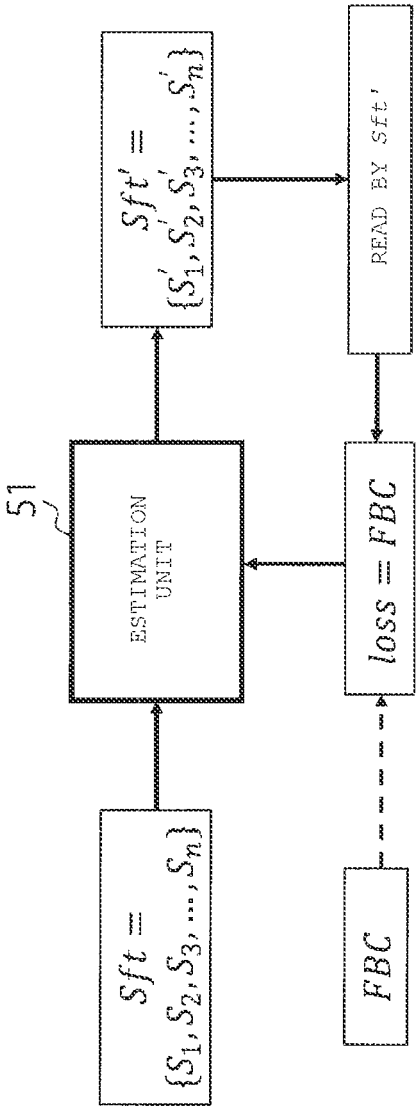
FIG. 9 is a schematic diagram illustrating an operation of an estimation unit according to a modification example of a first embodiment.

FIG. 9 is a schematic diagram illustrating an operation of the estimation unit 51 according to a modification example of the first embodiment. The estimation unit 51 illustrated in FIG. 9 will be described mainly with respect to differences from the estimation unit 51 illustrated in FIG. 8.

In FIG. 9, the shift quantity Sft is input to the estimation unit 51, and the shift quantity Sft' is output from the estimation unit 51. The estimation unit 51 of the present modification example also outputs the shift quantity Sft' obtained by compressing and decompressing the original shift quantity Sft.

FIG. 9 also illustrates use of an FBC value. The FBC value is calculated for each block of the memory cell array 45 (FIG. 4), for example. As described above, the FBC value of each block is the total number of erroneously read bits when stored data of each block is read. The FBC in the present modification example is input to the estimation unit 51 as a loss value. Training according to the present modification example is performed by using the FBC value. In some examples, the FBC value may be calculated by a functional block other than the estimation unit 51 in the memory controller 11 or may be calculated by the estimation unit 51. The training according to the present modification example is performed such that the FBC value approaches zero.

In the present modification example, when the shift quantity Sft' is output from the estimation unit 51, a read operation is performed by using a determination voltage corresponding to the shift quantity Sft'. After that, the FBC value for this read operation is calculated. This FBC value is input to the estimation unit 51 for training purposes. In addition, this FBC value can be stored and managed as block management information as described above.

Figure 10:
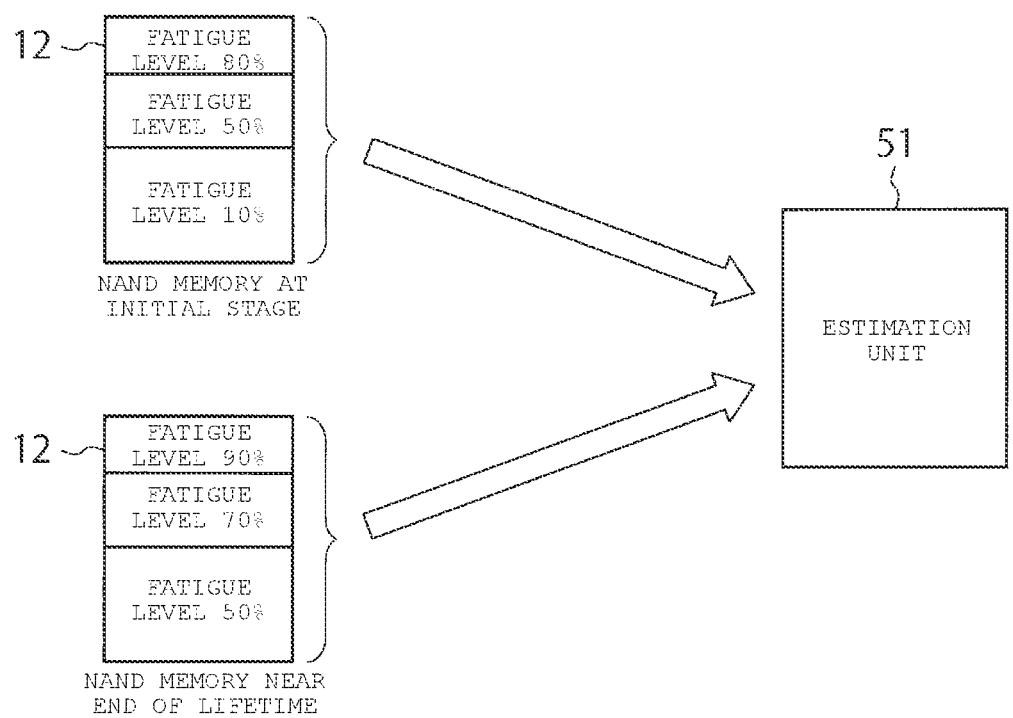
FIG. 10 is a schematic diagram illustrating aspects of an operation of an estimation unit according to a first embodiment.

FIG. 10 is a schematic diagram illustrating an operation of the estimation unit 51 according to the first embodiment. The estimation unit 51 illustrated in FIG. 10 operates in a same general manner as the estimation unit 51 illustrated in FIG. 8, but may instead operate in a same general manner as the estimation unit 51 illustrated in FIG. 9.

FIG. 10 illustrates an example of a fatigue level (wear level) of the NAND memory 12 at an initial stage and an example of the fatigue level of the NAND memory 12 near the end of device lifetime. The NAND memory 12 at the initial stage includes a memory cell having a fatigue level of 80%, a memory cell having a fatigue level of 50%, and a memory cell having a fatigue level of 10%. The NAND memory 12 near the end of device lifetime includes a memory cell having a fatigue level of 90%, a memory cell having a fatigue level of 70%, and a memory cell having a fatigue level of 50%.

The NAND memory 12 at the initial stage includes many memory cells having the low fatigue levels. The NAND memory 12 near the end of device lifetime includes many memory cells having high fatigue levels. It is generally considered that a value of an appropriate determination voltage (shift quantity Sft) will change according to such fatigue level differences. With the present embodiment, training may be performed by the estimation unit 51 after shipment of the memory system 1, so that it is possible to maintain high read accuracy even if the fatigue level is changed by changing the determination voltage (shift quantity Sft) to follow or otherwise account for the fatigue level increases.

Next, more details of the compression unit 21 and the decompression unit 22 according to the present embodiment will be described with reference to FIGS. 11A and 11B and FIGS. 12A and 12B.

FIGS. 11A and 11B are schematic diagrams illustrating an operation of the compression unit 21 and the decompression unit 22 according to the first embodiment.

In FIG. 11A, the compression unit 21 compresses the shift quantity Sft to the compression vector v. Specifically, the compression unit 21 selects four shift values $S_4$, $S_7$, $S_{10}$, and $S_{14}$ from fifteen shift values $S_1$ to $S_{15}$ of the shift quantity Sft, and outputs the selected shift values $S_4$, $S_7$, $S_{10}$, and $S_{14}$ as the components $v_1$, $v_2$, $v_3$, and $v_4$ of the compression vector v, respectively. Hereinafter, the components $v_1$ to $v_4$ of the compression vector v are also referred to as "vector components $v_1$ to $v_4$".

In FIG. 11A, the compression unit 21 compresses the shift quantity Sft to the compression vector v by using a function that has the shift values $S_1$ to $S_{15}$ as inputs and the vector components $v_1$ to $v_4$ as outputs. A relationship $v_1=S_4$, $v_2=S_7$, $v_3=S_{10}$, and $v_4=S_{14}$ is established between these inputs and outputs. Thus, the compression unit 21 according to the present embodiment compresses the shift quantity Sft to the compression vector v by using a static function.

Further, in the present embodiment, each of the vector components $v_1$ to $v_4$ depends on one of the shift values $S_1$ to $S_{15}$, and each of the vector components $v_1$ to $v_4$ may depend on two or more of the shift values $S_1$ to $S_{15}$. For example, the vector component $v_1$ may be given by $v_1=\sqrt{(S_1 \times S_3)}$.

In FIG. 11B, the decompression unit 22 decompresses the compression vector v to the shift quantity Sft. Since the vector components $v_1$ to $v_4$ include only part of information of the shift values $S_1$ to $S_{15}$, it is difficult to decompress the compression vector v to the shift quantity Sft with high accuracy by using such a function. Therefore, the decompression unit 22 according to the present embodiment includes the estimation unit 51. The decompression unit 22 decompresses the compression vector v to the shift quantity Sft by estimating the shift quantity Sft from the compression vector v with the estimation unit 51. This estimation error may be reduced by the training process described above. This estimation may be performed by using the vector components $v_1$ to $v_4$ and/or other values. Examples of such values are an elapsed time t after a write operation and a W/E cycle PE.

Since the compression unit 21 according to the present embodiment uses a function to compress the shift quantity Sft to the compression vector v, the compression unit 21 according to the present embodiment may not need to include the estimation unit 51. With the present embodiment, it is possible to easily perform compression by performing the compression using the function.

Figure 12A:
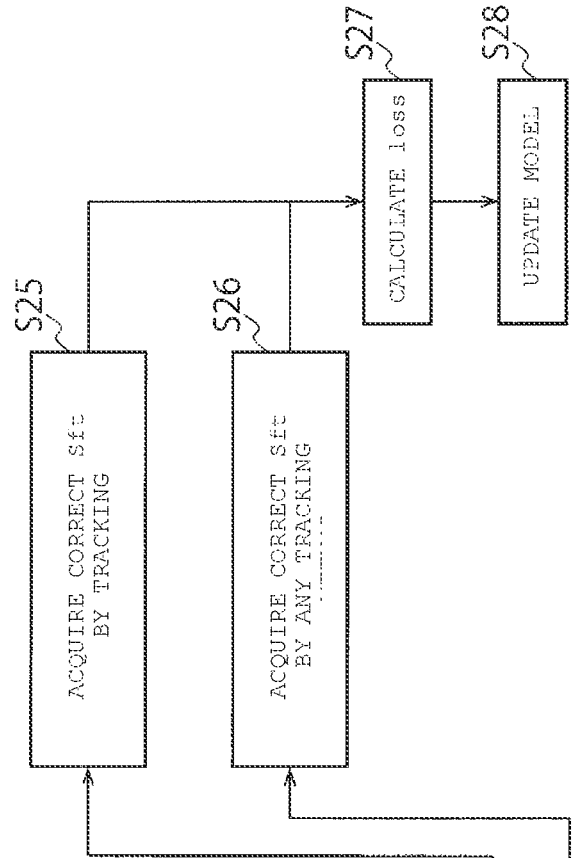
FIGS. 12A and 12B are flowcharts of an operation of a compression unit and a decompression unit according to a first embodiment.
Figure 12B:
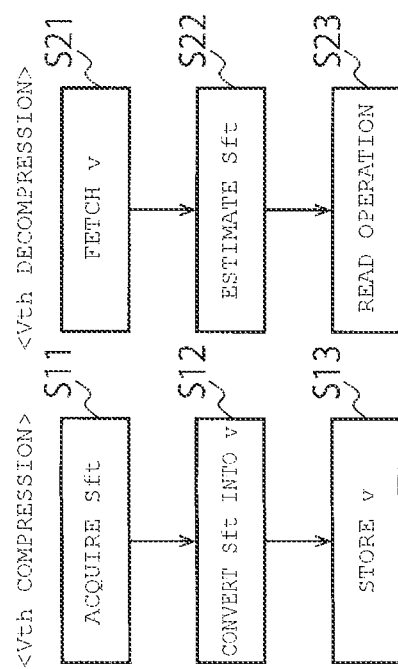

FIGS. 12A and 12B are flowcharts illustrating an operation of the compression unit 21 and the decompression unit 22 according to the first embodiment.

FIG. 12A illustrates an operation flow of the compression unit 21.

First, the compression unit 21 acquires the shift quantity Sft (S11). Each component (shift value) of the shift quantity Sft may be calculated by subtracting a predetermined voltage from a determination voltage (read threshold voltage Vth), as described with reference to FIGS. 6A to 6C.

Next, the compression unit 21 converts the shift quantity Sft to the compression vector v (S12). This conversion can be performed by using the function process described above.

Next, the compression unit 21 stores the compression vector v (S13). The compression vector v is stored into the NAND memory 12 as block management information, for example.

FIG. 12B illustrates an operation flow of the decompression unit 22 and the like.

First, the decompression unit 22 fetches the compression vector v stored in the NAND memory 12 to a RAM 12b (S21). Next, the decompression unit 22 estimates the shift quantity Sft from the compression vector v (S22). This estimation is performed by the estimation unit 51 in this example.

Next, the memory system 1 performs a read operation by using the determination voltage obtained from this shift quantity Sft (S23). At this time, when the read operation is successful (YES in S24), the shift quantity Sft' described above following the shift quantity Sft is acquired by the estimation unit 51 as a correct shift quantity Sft (S25). On the other hand, when the read operation fails (NO in S24), another method can be used to acquire the correct shift quantity Sft instead of the shift quantity Sft' (S26).

Next, the decompression unit 22 (estimation unit 51) calculates the loss value described above (S27). The loss value is calculated by using, for example, the loss function L (Sft, Sft'). Next, the calculated loss value is input to the estimation unit 51, and the estimation unit 51 (DNN model) is updated (S28).

As described above, the memory controller 11 according to the present embodiment compresses the shift quantity Sft of the determination voltage to the compression vector v, and stores the compression vector v into the memory region of the NAND memory 12. Therefore, it is possible to appropriately store the determination voltages for the threshold voltages of a multilevel memory into the memory region. For example, it is possible to reduce overload on the memory region while reducing the error between the determination voltage before compression and the determination voltage after decompression.

Second Embodiment

Figure 13:
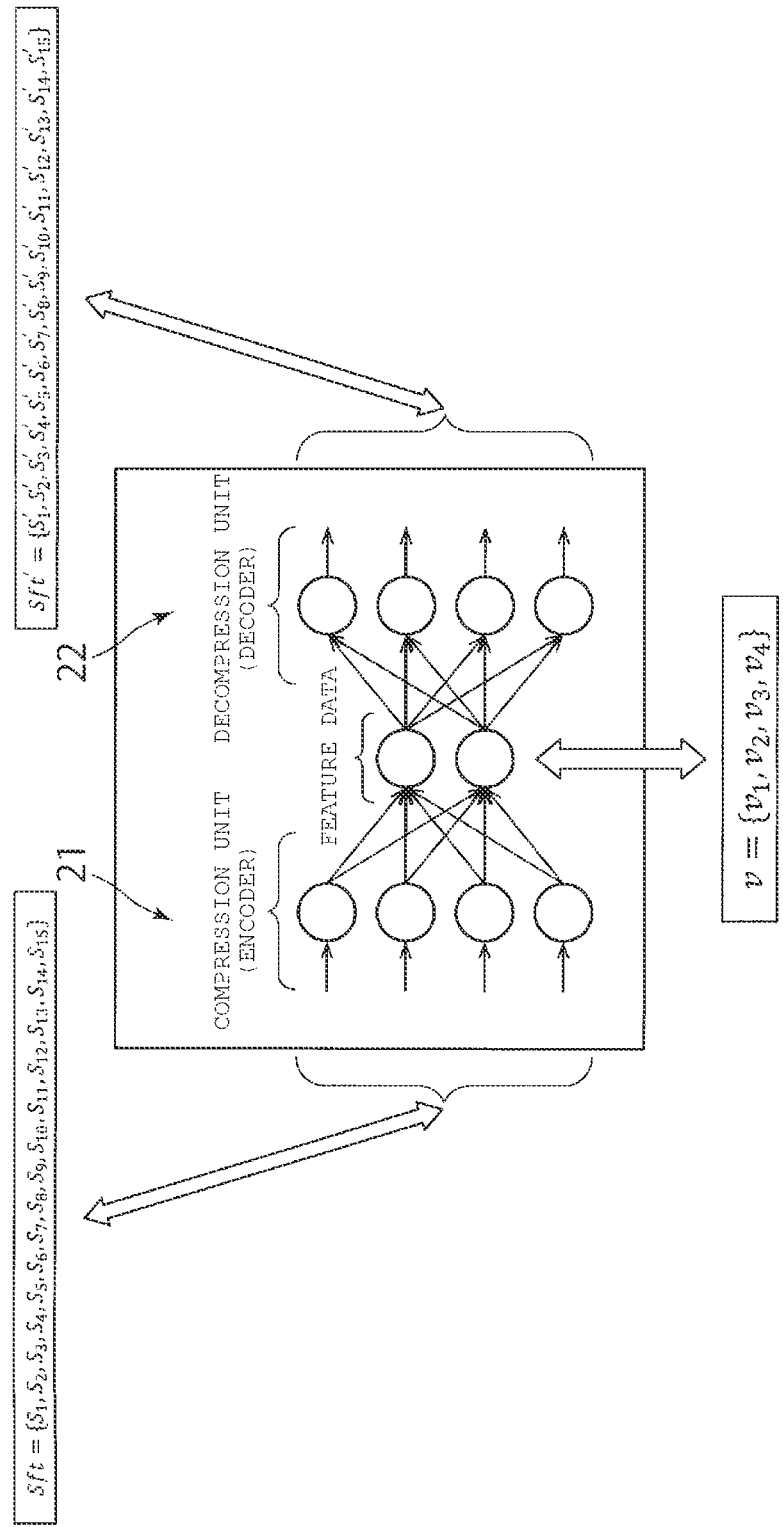
FIG. 13 is a schematic diagram illustrating an operation of a compression unit and a decompression unit according to a second embodiment.

FIG. 13 is a schematic diagram illustrating an operation of a compression unit 21 and a decompression unit 22 according to a second embodiment. The compression unit 21 and the decompression unit 22 illustrated in FIG. 13 correspond to a modification example of the compression unit 21 and the decompression unit 22 illustrated in FIGS. 11A and 11B.

In the second embodiment, each of the compression unit 21 and the decompression unit 22 includes an estimation unit 51 illustrated in FIG. 8. Therefore, the compression unit 21 according to the second embodiment compresses the shift quantity Sft to the compression vector v by estimating the compression vector v from the shift quantity Sft using the estimation unit 51. In addition, the decompression unit 22 according to the second embodiment decompresses the compression vector v to the shift quantity Sft by estimating the shift quantity Sft from the compression vector v using the estimation unit 51. Each of the compression unit 21 and the decompression unit 22 may include an estimation unit 51 illustrated in FIG. 9 instead of the estimation unit 51 illustrated in FIG. 8.

In the second embodiment, the compression unit 21 includes an encoder as an estimation unit 51, and the decompression unit 22 includes a decoder as an estimation unit 51 (FIG. 13). The encoder converts the shift quantity Sft to feature data (compression vector v), and the decoder inversely converts the feature data to the shift quantity Sft. In FIG. 13, the shift quantity Sft obtained by inverse conversion (restoration) is denoted by the symbol Sft' to distinguish the shift quantity Sft from the original shift quantity Sft. FIG. 13 illustrates an autoencoder configured with two neural networks for the encoder and the decoder. The encoder and decoder are examples of first and second neural networks, respectively. With the second embodiment, compression and decompression are performed by estimation rather than by a function, so that, for example, it is possible to achieve a read for which a fatigue level will be more accurately reflected.

Figure 14A:
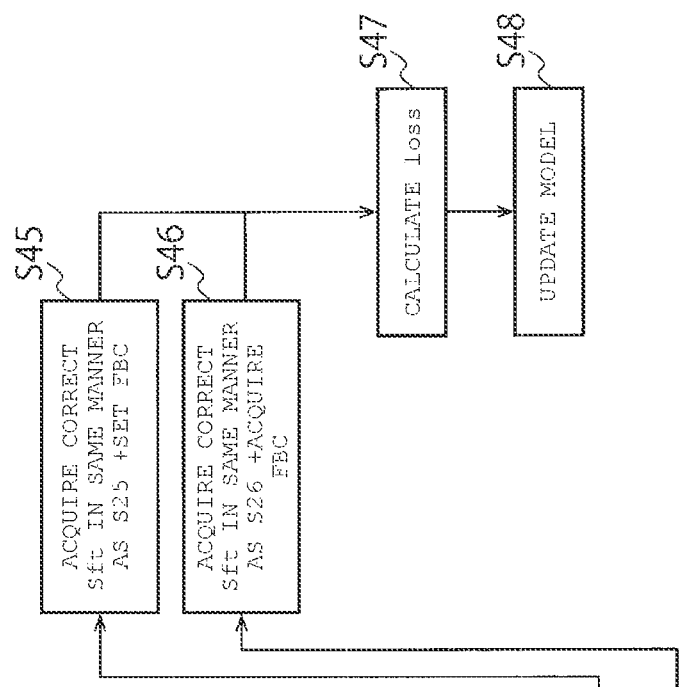
FIGS. 14A and 14B are flowcharts illustrating an operation of a compression unit and a decompression unit according to a second embodiment.
Figure 14B:
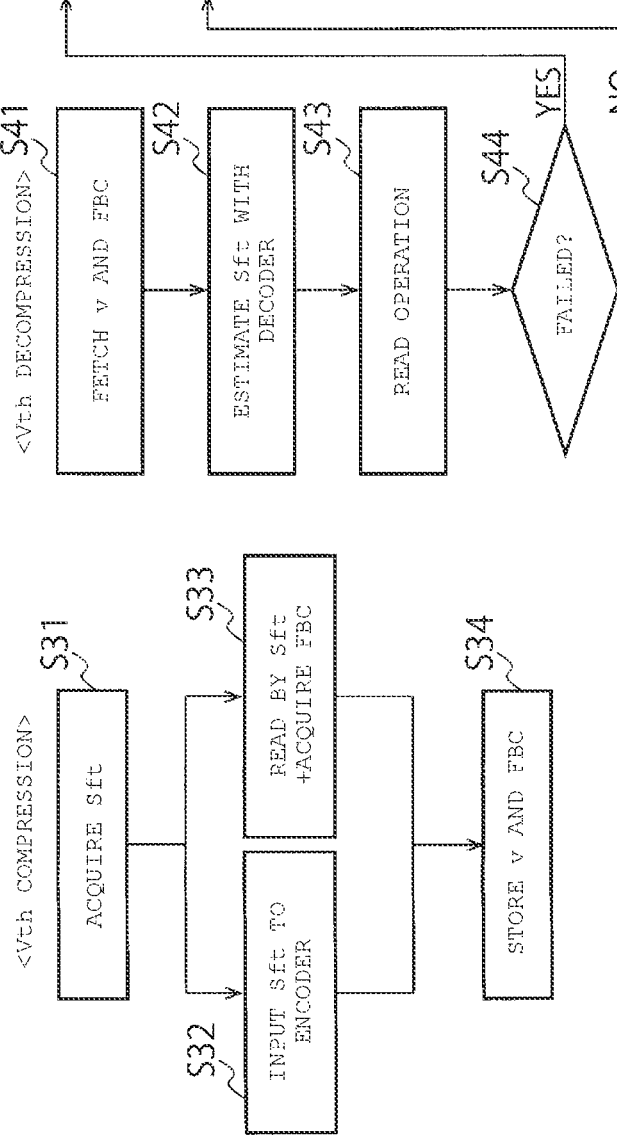

FIGS. 14A and 14B are flowcharts illustrating the operation of the compression unit 21 and the decompression unit 22 according to the second embodiment. A flow illustrated in FIGS. 14A and 14B corresponds to a modification example of the flow illustrated in FIGS. 12A and 12B.

FIG. 14A illustrates an operation flow of the compression unit 21 and the like.

First, the compression unit 21 acquires the shift quantity Sft (S31). Next, the compression unit 21 inputs the shift quantity Sft to the encoder to calculate the compression vector v (S32). In addition, the memory system 1 performs a read operation by using a determination voltage corresponding to the shift quantity Sft, and acquires an FBC (S33). Next, the compression unit 21 stores the compression vector v and the FBC value (S34). The compression vector v and the FBC value are stored into the NAND memory 12 as block management information or the like.

FIG. 14B illustrates an operation flow of the decompression unit 22 and the like.

First, the decompression unit 22 fetches the compression vector v and the FBC value stored in the NAND memory 12 to the RAM 12b (S41). Next, the decompression unit 22 inputs the compression vector v to the decoder, and estimates the shift quantity Sft (S42).

Next, the memory system 1 performs a read operation by using a determination voltage obtained from this shift quantity Sft (S43). At this time, when the read operation is successful (YES in S44), the shift quantity Sft' following the shift quantity Sft is acquired by the estimation unit 51 as a correct shift quantity Sft (S45). On the other hand, when the read operation fails (NO in S44), another method is used to acquire the correct shift quantity Sft instead of the shift quantity Sft' (S46). In each of S45 and S46, the FBC value related to this read operation is also acquired.

Next, the decompression unit 22 (estimation unit 51) calculates the loss value (S47). The loss value is given by the FBC value, for example. Next, the calculated loss value is input to the estimation unit 51, and the estimation unit 51 (DNN model) is updated (S48).

In the same manner as the memory controller 11 according to the first embodiment, the memory controller 11 according to the second embodiment compresses the shift quantity Sft of the determination voltage to the compression vector v, and stores the compression vector v into the memory region of the NAND memory 12. Therefore, with the second embodiment, it is possible to appropriately store the determination voltage of the threshold voltage for the multilevel memory into the memory region. For example, it is possible to reduce overload on the memory region while reducing the error between the determination voltage before compression and the determination voltage after decompression.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory controller, comprising:
  a compression unit configured to compress n determination voltage values for threshold voltages of a memory cell to a vector quantity including a total of m vector components, where n and m are integers satisfying the relationship n>m≥2, the memory cell being capable of storing three or more data values therein according to the n determination voltage values;
  a storing unit configured to store the vector quantity into a memory region; and
  a decompression unit configured to decompress the stored vector quantity to provide the n determination voltage values for reading data values from or writing data values to the memory cell.

2. The memory controller according to claim 1, wherein the compression unit is configured to compress a shift value for the n determination voltage values from a predetermined voltage to the vector quantity.

3. The memory controller according to claim 1, wherein the n determination voltage values are set for each block of a memory array.

4. The memory controller according to claim 1, wherein the n determination voltage values are set for each word line of a memory array.

5. The memory controller according to claim 1, wherein at least one of the compression unit and the decompression unit is trained based on an error between a determination voltage value before being compressed by the compression unit and a corresponding determination voltage value after being decompressed from the stored vector quantity by the decompression unit.

6. The memory controller according to claim 1, wherein at least one of the compression unit and the decompression unit is trained based on a fail bit count (FBC) value for data read from a memory array.

7. The memory controller according to claim 6, wherein the storing unit is configured to store the vector quantity in associated with the FBC value in the memory region.

8. The memory controller according to claim 1, wherein the compression unit is configured to compress the n determination voltage values to the vector quantity by converting a subset of values selected from the n determination voltage values to the m vector components of the vector quantity.

9. The memory controller according to claim 8, wherein the decompression unit is configured to decompress the vector quantity to provide the n determination voltage values by estimating each determination voltage value from the vector quantity.

10. The memory controller according to claim 9, wherein the decompression unit is configured to adjust the estimation of each determination voltage value from the vector quantity to reduce an error between estimated determination voltage value and a corresponding determination voltage value.

11. The memory controller according to claim 1, wherein the compression unit is configured to compress the n determination voltage values to the vector quantity by a first neural network.

12. The memory controller according to claim 11, wherein the decompression unit is configured to decompress the vector quantity to provide the n determination voltage values by a second neural network.

13. A memory controller control method, comprising:
  compressing n determination voltage values for threshold voltages of a memory cell to a vector quantity including a total of m vector components, where n and m are integers satisfying the relationship n>m≥2, the memory cell being capable of storing three or more data values therein according to the n determination voltage values;
  storing the vector quantity into a memory region; and
  decompressing the stored vector quantity to provide the n determination voltage values for reading data values from or writing data values to the memory cell.

14. The memory controller control method according to claim 13, further comprising:
  compressing a shift value of the n determination voltage values from a predetermined voltage to the vector quantity.

15. A memory system, comprising:
  a memory array including a memory cell capable of storing three or more data values therein according to different threshold values of the memory cell; and
  a memory controller including:
    a compression unit configured to compress n determination voltage values for the threshold voltages of the memory cell to a vector quantity including a total of m vector components, where n and m are integers satisfying the relationship n>m≥2;

a storing unit configured to store the vector quantity into a memory region of the memory array; and a decompression unit configured to decompress the stored vector quantity to provide the n determination voltage values.

16. The memory system according to claim 15, wherein the n determination voltage values are set for each block of the memory array.

17. The memory system according to claim 15, wherein the n determination voltage values are set for each word line of the memory array.

* * * * *